United States Patent
Yoganandan et al.

(10) Patent No.: US 7,208,738 B2
(45) Date of Patent: Apr. 24, 2007

(54) LIGHT SOURCE UTILIZING AN INFRARED SENSOR TO MAINTAIN BRIGHTNESS AND COLOR OF AN LED DEVICE

(76) Inventors: Sundar Natarajan Yoganandan, P-10-1 Desa Permal Indah, Jalan Helang, 11700 Gelugor, Pulau Penang (MY); Fakhrul Arifin Mohd. Afif, 12, LRU, Pauh Jaya 4/9, Pauh Jaya, Permatang Pauh 13700 Prai, Pensang (MY); Klan Shin Lee, 2373 Kg Selamat, 13300 Tasek Gelugor, S.P.U., Penang (MY); Siew It Pang, 22 Persiaran Kellcap 3, Bayan Lepas, 11900 Penang (MY); Kheng Leng Tan, 29-11-05 Tingkat Bukit Jambul 1, 11950 Penang (MY); Yew Cheong Kuan, 8-5-4, Desa University, Jin Sungal Dua, 11700 Penang (MY); Su Lin Oon, 106-8-3 Villa Emas, Persiaran Bayan Indah, Sq. Nibong, 11900 Penang (MY); Wen Ya Ou, F-0-11 Flat UDA, Tanjung Tokong, 10470 Penang (MY); Norfidathul Aizar Abdul Karim, 10, Lorong 12/SS1, Bandar Tasek Mutiara, Simpang Ampat 14120 Seberang Perai (MY); Thye Linn Mok, 35, Medan Binjal Tarman Srl Rambal, 14000 Bukit Mertajam, Penang (MY)

( * ) Notice: Subject to any disclaimer, the term of this patent is extended or adjusted under 35 U.S.C. 154(b) by 153 days.

(21) Appl. No.: 11/069,315

(22) Filed: Feb. 28, 2005
(Under 37 CFR 1.47)

(65) Prior Publication Data
US 2006/0192125 A1    Aug. 31, 2006

(51) Int. Cl.
*G01J 1/42* (2006.01)
*H01L 27/15* (2006.01)
(52) U.S. Cl. ............... 250/354.1; 250/339.04; 250/493.1; 250/495.1; 257/80; 438/24
(58) Field of Classification Search ............. 250/354.1, 250/338.04, 493.1, 495.1; 257/80; 438/24
See application file for complete search history.

(56) References Cited
U.S. PATENT DOCUMENTS
6,037,644 A * 3/2000 Daghighian et al. ........ 257/444

(Continued)

FOREIGN PATENT DOCUMENTS
JP    01239969 A * 9/1989

*Primary Examiner*—Albert Gagliardi

(57) ABSTRACT

A light source is disclosed. The light source has a light-emitting chip that includes an LED that generates light in an active region thereof. The LED emits a light signal in a forward direction, and infrared radiation generated in the active region is emitted in a side direction in the form of a first infrared signal. The first light signal is determined by a first drive signal coupled to the LED. The light source also includes an infrared detector positioned to collect a portion of the infrared signal. The infrared detector generates a heat signal indicative of the amount of infrared radiation detected. A controller generates the drive signal so as to maintain the heat signal at a first target value. In light sources having LEDs that emit in different spectral ranges, the infrared detectors can all detect heat in the same spectral range.

9 Claims, 2 Drawing Sheets

U.S. PATENT DOCUMENTS

| | | | |
|---|---|---|---|
| 6,541,291 B2 * | 4/2003 | Kuniyasu | 438/22 |
| 6,611,000 B2 * | 8/2003 | Tamura et al. | 257/80 |
| 6,677,572 B2 * | 1/2004 | Ishii et al. | 250/214.1 |
| 6,847,053 B2 * | 1/2005 | Kuhara et al. | 257/82 |
| 6,894,314 B2 * | 5/2005 | Musk | 257/80 |
| 7,026,655 B2 * | 4/2006 | Go et al. | 257/81 |
| 2004/0007709 A1 * | 1/2004 | Kondo | 257/80 |
| 2004/0256625 A1 * | 12/2004 | Russell et al. | 257/80 |
| 2005/0199815 A1 * | 9/2005 | Murakumo et al. | 250/354.1 |

* cited by examiner

LIGHT SOURCE UTILIZING AN INFRARED SENSOR TO MAINTAIN BRIGHTNESS AND COLOR OF AN LED DEVICE

BACKGROUND OF THE INVENTION

Light emitting diodes (LEDs) are attractive candidates for replacing conventional light sources such as incandescent lamps and fluorescent light sources. The LEDs have higher light conversion efficiencies and longer lifetimes than incandescent lamps. In addition, the LEDs require lower operating voltages and are more economical than fluorescent light sources.

Unfortunately, an LED produces light in a relatively narrow spectral band. Hence, to produce a light source that is perceived to have an arbitrary color, a compound light source having multiple LEDs is typically utilized. For example, an LED-based light source that provides an emission that is perceived as matching a particular color can be constructed by combining light from red, green, and blue emitting LEDs. The ratio of the intensities of the various colors sets the color of the light as perceived by a human observer.

To provide the correct color over the lifetime of the light source, the intensities of the LEDs must be adjusted as the light source ages. The light generated by the individual LEDs changes over the lifetime of the LED. The rate of change varies with the type of LED and the particular production lot in which the LED is produced. Accordingly, the current through each LED must be adjusted to maintain the correct intensity as the LED ages.

One method for compensating for these shifts utilizes a feedback system that monitors the intensity of light generated by each LED and adjusts the drive current of each LED to maintain the light intensity at a predetermined value. If the light source consists of one LED of each color, the monitoring system can utilize a set of photodiodes and wavelength filters to measure the light generated by each LED. Unfortunately, the intensity of light that can be obtained from a single LED of each color is often too low for many applications. In such situations, light sources that utilize a plurality of LEDs of each color are often utilized. A single set of photodiodes cannot provide the individual intensities for the feedback loop in these systems. Accordingly, some form of monitoring system that measures the output from each LED separately is needed. In addition, each monitoring photodiode must be provided with a separate wavelength filter or be constructed from a material that is only sensitive in a narrow range of wavelengths. This increases the number of different parts that must be supplied to manufacture the light source, and hence, increases the cost and complexity of the light source.

SUMMARY OF THE INVENTION

The present invention includes a light source having a first light-emitting chip that includes an LED that generates light in an active region thereof. The LED emits a first light signal in a forward direction, and infrared radiation generated in the active region is emitted in a side direction in the form of a first infrared signal. The first light signal is determined by a first drive signal coupled to the LED. The light source also includes a first infrared detector positioned to collect a portion of the first infrared signal. The first infrared detector generates a first heat signal indicative of the amount of infrared radiation detected. A controller generates the first drive signal so as to maintain the first heat signal at a first target value. The first infrared detector detects radiation at wavelengths above 700 nm in one embodiment of the invention. In one embodiment, the controller includes a port for receiving a signal specifying a desired light output level, and the controller includes a calibration function for correlating the first heat signal to the first desired light output level. In one embodiment, the light source further includes a second light emitting chip having an LED that generates light in an active region thereof. The LED emits a second light signal in a forward direction, and infrared radiation generated in the active region is emitted in a side direction in the form of a second infrared signal, the second light signal is determined by a second drive signal coupled to that LED. This light source also includes a second infrared detector positioned to collect a portion of the second infrared signal. The second infrared detector generates a second heat signal indicative of the amount of infrared radiation detected. The second infrared detector is positioned such that the second infrared detector does not detect the first infrared signal. The controller generates the second drive signal so as to maintain the second heat signal at a second target value. In one embodiment, the first and second infrared detectors measure infrared radiation in the same spectral band, whereas the first and second LEDs generate light in different spectral bands.

DETAILED DESCRIPTION OF THE PREFERRED EMBODIMENTS OF THE INVENTION

Figure 1:
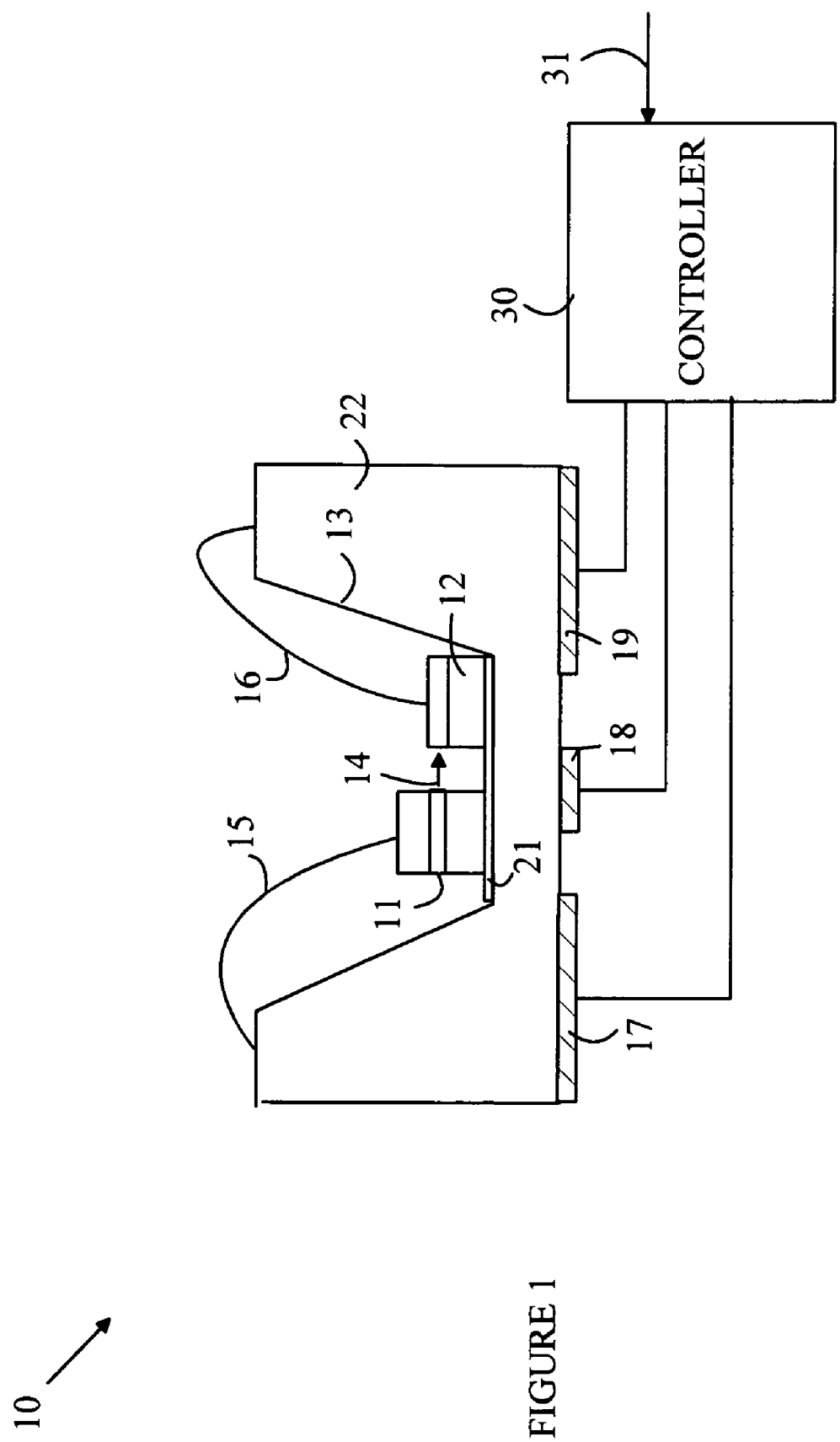
FIG. 1 is a cross-sectional view of a light source according to one preferred embodiment of the present invention.

The present invention utilizes the heat generated by the light-emitting layer in the LED to monitor the amount of light that is generated by the LED. An infrared sensor that is located near the LED-containing die views the active region of the LED to measure the heat generated in the active region. Since the LED measures heat rather than light at the wavelength generated by the LED, the same sensor can be utilized for LEDs of different colors thereby eliminating the need for different types of sensors for each type of LED. The manner in which the present invention operates can be more easily understood with reference to FIG. 1, which is a cross-sectional view of a light source 10 according to one preferred embodiment of the present invention. Light source 10 includes an LED 11 and an infrared detector 12 that are located in a reflector cup 13. Infrared detector 12 is positioned to view the active region of LED 11 from the side, and hence, detect the infrared light leaving the side of LED 11 as shown at 14.

The present invention is based on the observation that there is a good correlation between the heat generated in the active region of the LED that escapes out of the edge of the LED and the amount of light being generated by the LED. In general, a significant fraction of the electromagnetic radiation that is generated in the active region of an LED is trapped in the active region because of the difference in refractive index between the active region and the surrounding layers. In particular, radiation that is emitted at angles less than the critical angle with respect to the LED surface is reflected back and forth within the LED until the radiation is either absorbed or exits the LED through the side of the LED. Since the fraction of the radiation that leaves the sides of the LED and the fraction that leaves the top surface in the forward direction are determined by the physical parameters of the LED, rather than the actual light output, this side-emitted radiation is highly correlated with the light that leaves the LED in the forward direction.

The current through the LED is controlled by a controller 30. Controller 30 also receives a signal from infrared detector 12 that indicates the amount of heat being generated by LED 11. In the embodiment shown in FIG. 1, LED 10 and infrared detector 111 have a common ground terminal 18 that is connected to the bottom sides of LED 11 and infrared detector 12 via a conducting mount 21. A second lead 15, which connects to controller 30 via terminal 17 is used to power LED 11 with a signal having an average amplitude that determines the amount of light per unit time that leaves LED 17. This signal can be a DC signal having an amplitude that is set by controller 30. Alternatively, the control signal can be an AC signal having a fixed amplitude and a variable duty cycle. In this case, the amount of the light output is determined by varying the duty cycle.

Infrared detector 12 is preferably a photodiode that is sensitive to radiation at wavelengths above 700 nm. The infrared detector generates a signal on lead 16 that is indicative of the intensity of light in this wavelength band received from LED 11. This signal is coupled to controller 30 via a terminal 19 that is coupled to lead 16 though a connection in mount 22. A similar arrangement is used to connect lead 15 to terminal 17.

For any given LED, there is a correlation between the light output in the visible range by that LED and the heat generated in the active region of the LED that is measured by infrared detector 12. This relationship can be ascertained by calibrating the signal from infrared detector 12 and the light output from LED 11 for various known light outputs. The calibration curve is then stored in controller 30. The calibration curve can be measured for each LED at the time of manufacturer. If the variation in this calibration curve from device to device is sufficiently small for any given manufacturing lot, then a common calibration curve can be provided based on selected samples of the lot.

In this embodiment, controller 30 receives a signal on an input port 31 that specifies the light level either directly or in terms of the desired signal from infrared detector 12. If the signal specifies the light intensity, then controller 30 determines the corresponding infrared signal value using the calibration curve discussed above. In either case, controller 30 then executes a feedback look that adjusts the drive signal to LED 11 to maintain the output of infrared detector 12 at the target value.

Figure 2:
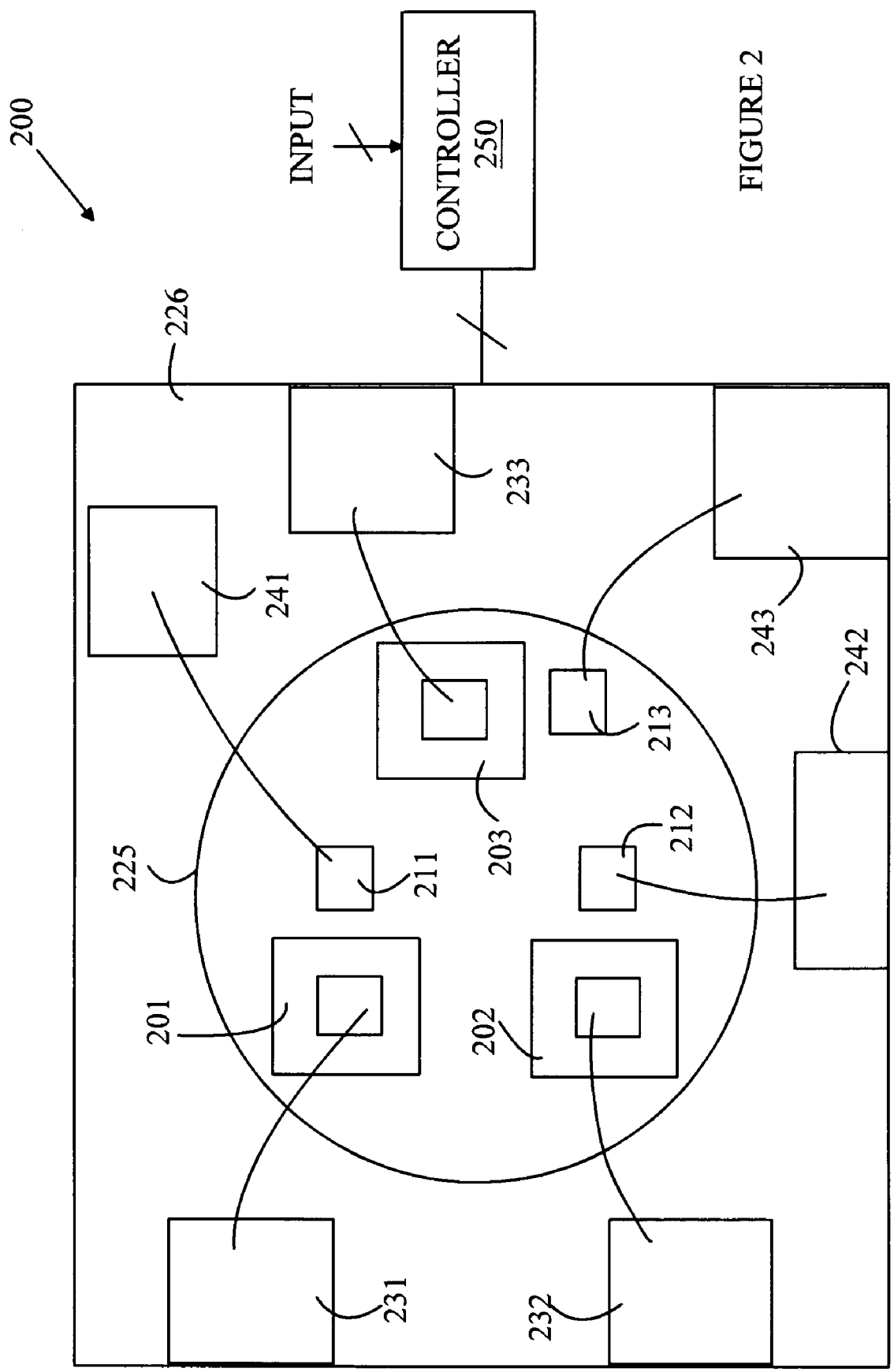
FIG. 2 is a top view of a light source having three LED assemblies that include an LED and a sub-mount.

The present invention can be used in light sources having multiple LEDs that must be separately controlled to provide a source of a specified color and brightness. Refer now to FIG. 2, which is a top view of a light source 200 having three LED assemblies 201–203 that include an LED and a sub-mount. The infrared detectors corresponding to assemblies 201–203 are shown at 211–213, respectively. The LEDs are mounted in a reflective cup 225 that is recessed in a carrier 226 that includes pads 231–233 for making connections to the LEDs and pads 241–243 for making connections to the infrared detectors. The signals from the infrared detectors are processed by a single controller 250 to provide the signals to the LEDs that control the average intensity of light leaving the LEDs.

While the individual LEDs can emit light in different spectral ranges or bands, the infrared detectors all measure radiation in the same spectral band. Hence, a single type of infrared detector can be used with each LED. Accordingly, the present invention is more cost effective than light sources that utilize a different light detector for each color of LED in the light source.

The above-describe embodiments of the present invention utilized a controller that was external to the carrier on which the LEDs and infrared detectors were mounted. However, embodiments in which the controller is included on the carrier or in a sub-mount under the LED can also be constructed without departing from the teachings of the present invention. If the controller is included as part of a sub-mount on which the LED and corresponding infrared detector is mounted, a light source having multiple LEDs can utilize multiple controllers instead of the single controller shown in FIG. 2. In such embodiments, the desired intensities for each color are communicated separately to the controller that controls the LED in question.

It should also be noted that the present invention is well suited to light sources that utilize an array of LEDs in which multiple LEDs having the same spectral output are present to provide increased intensity. Since each infrared detector is positioned such that the detector only views the radiation from one LED, interference from other LEDs is substantially reduced. Accordingly, the feedback system can adjust the individual LEDs without interference from other LEDs having the same spectral output.

Various modifications to the present invention will become apparent to those skilled in the art from the foregoing description and accompanying drawings. Accordingly, the present invention is to be limited solely by the scope of the following claims.

What is claimed is:

1. A light source comprising a first light emitting chip having an LED that generates light in an active region thereof, said LED emitting a first light signal in a forward direction and infrared radiation generated in said active region in a side direction in the form of a first infrared signal, said first light signal being determined by a first drive signal coupled to that LED;

a first infrared detector positioned to collect a portion of said first infrared signal and to generate a first heat signal indicative of the amount of infrared radiation detected; and a controller that generates said first drive signal so as to maintain said first heat signal at a first target value.

2. The light source of claim 1 wherein said first infrared detector detects radiation at wavelengths above 700 nm.

3. The light source of claim 1 wherein said controller comprises a port for receiving a signal specifying a desired light output level and wherein said controller further comprises a calibration curve for correlating said first heat signal to said first desired light output level.

4. The light source of claim 1 further comprising a second light emitting chip having an LED that generates light in an active region thereof, said LED emitting a second light signal in a forward direction and infrared radiation generated in said active region in a side direction in the form of a second infrared signal, said second light signal being determined by a second drive signal coupled to that LED; and a second infrared detector positioned to collect a portion of said second infrared signal and to generate a second heat signal indicative of the amount of infrared radiation detected, said second infrared detector being positioned such that said second infrared detector does not detect said first infrared signal, wherein said controller generates said second drive signal so as to maintain said second heat signal at a second target value.

5. The light source of claim 4 wherein said first and second infrared detectors measure infrared radiation in the same spectral band and wherein said first and second LEDs generate light in different spectral bands.

6. A method for controlling a light source comprising a plurality of LEDs, each LED comprising a light emitting chip, said light emitting chip emitting light in a forward direction and infrared radiation in a side direction, said light generated in said forward direction being determined by a drive signal coupled to that LED, a portion of said infrared radiation emitted in said side direction leaving said chip, said method comprising:

collecting a portion of said infrared radiation leaving said chip in said side direction to generate an infrared signal corresponding to each of said LEDs; and controlling said drive signals of said LEDs to maintain each of said infrared signals at a target value corresponding to that LED.

7. The method of claim 6 wherein said collected infrared radiation comprises a radiation at wavelengths above 700 nm.

8. The method of claim 6 further comprising receiving a signal specifying a desired light output level for said LED and utilizing a calibration curve to determine said target value for at least one of said LEDs.

9. The method of claim 6 wherein said infrared signals correspond to the intensity of infrared radiation detected in a predetermined band of wavelengths that is the same for all of said LEDs, and wherein one of said LEDs generates light in a first spectral band and a second one of said LEDs generates light in a second spectral band, said first spectral band being different from said second spectral band.

* * * * *